United States Patent
Hielscher et al.

(10) Patent No.: US 9,114,426 B2
(45) Date of Patent: Aug. 25, 2015

(54) ULTRASONIC GENERATOR WITH A RESONATOR HAVING A CLAMPING OPENING

(71) Applicant: Dr. Hielscher GmbH, Teltow (DE)

(72) Inventors: Harald Hielscher, Stahnsdorf (DE); Thomas Hielscher, Stahnsdorf (DE); Holger Hielscher, Teltow (DE)

(73) Assignee: Dr. Hielscher GmbH, Teltow (DE)

( * ) Notice: Subject to any disclaimer, the term of this patent is extended or adjusted under 35 U.S.C. 154(b) by 364 days.

(21) Appl. No.: 13/666,076

(22) Filed: Nov. 1, 2012

(65) Prior Publication Data

US 2013/0119824 A1    May 16, 2013

Related U.S. Application Data

(60) Provisional application No. 61/554,564, filed on Nov. 2, 2011.

(51) Int. Cl.
*B06B 1/06* (2006.01)
*B06B 3/00* (2006.01)
*H01L 41/113* (2006.01)

(52) U.S. Cl.
CPC .............. *B06B 3/00* (2013.01); *B06B 1/0603* (2013.01); *H01L 41/1132* (2013.01)

(58) Field of Classification Search
CPC ..... H01L 41/113; H01L 41/1132; B06B 1/06; B06B 1/0603
USPC ............... 310/322, 323.01–323.21, 328, 334, 310/336–338
See application file for complete search history.

(56) References Cited

U.S. PATENT DOCUMENTS

| | | | | |
|---|---|---|---|---|
| 4,304,126 A * | 12/1981 | Yelke | ............................ | 310/338 |
| 4,373,401 A * | 2/1983 | Baumoel | ...................... | 310/334 |
| 5,214,343 A * | 5/1993 | Baumoel | ...................... | 310/334 |
| 5,384,508 A * | 1/1995 | Vaxelaire | ..................... | 310/334 |
| 5,410,206 A * | 4/1995 | Luecke et al. | ................ | 310/328 |

\* cited by examiner

*Primary Examiner* — Derek Rosenau

(57) ABSTRACT

The invention relates to an ultrasonic generator (1) with a resonator (3) for transmitting ultrasonic sound to a medium (6) arranged in a receptacle (5). In order to efficiently transmit the ultrasonic sound from the resonator (3) to the medium (6) via the receptacle (5) the resonator (3) comprises a clamping opening (4) for clampingly receiving the receptacle (5).

15 Claims, 1 Drawing Sheet

ULTRASONIC GENERATOR WITH A RESONATOR HAVING A CLAMPING OPENING

RELATED APPLICATION

This application claims the benefit of priority under 35 USC §119(e) of U.S. Provisional Patent Application No. 61/554,564 filed Nov. 2, 2011, the contents of which are incorporated herein by reference in their entirety.

TECHNICAL FIELD

This patent application generally relates to an ultrasonic generator with an ultrasonic source for generating ultrasonic sound and a resonator for emitting ultrasonic sound to a medium, the resonator being connected to the ultrasonic source in an ultrasonic sound receiving manner.

BACKGROUND

Ultrasonic generators with an ultrasonic source and a resonator for emitting ultrasonic sound are known in the art. The ultrasonic generator is used for treating a medium, e.g. a fluid or a liquid with ultrasonic sound, in particular with low-frequency-power-ultrasonic oscillations. Usually, the medium is arranged in a receptacle, for instance in a conduit like a pipe, or a container like a beaker. In the container, the medium may be stationary and in the conduit, the medium may flow. Media are often provided in disposable receptacles when treating the media with ultrasonic sound.

Low-frequency-power-ultrasonic sound is ultrasonic sound with a working frequency between 15 and 100 kHz, preferable 15 to 60 kHz, for instance 26 kHz and an acoustic power above 5 W, preferable between 10 W and 32000 W, e.g. 200 W. For generating the ultrasonic sound, the ultrasonic source is e.g. a piezoelectric or magnetostrictive source. The resonator may be a sound transducer, converting the ultrasonic sound to ultrasonic oscillations. Media treated with ultrasonic sound are e.g. fluids, dispersions, emulsions, suspensions, pastes, paints, dyes, inks or nano materials. The media can have various viscosities between 0 mPa*s to $3*10^{10}$ mPa*s, preferably 0.1 to $1*10^{6}$ mPa*s, e.g. 200 mPa*s.

For ultrasonic treatment, the resonator may transmit oscillations with amplitudes between 1 to 350 µm, preferably 5 to 50 µm and e.g. 15 µm directly or indirectly to the media. Lambda is a wavelength that results from the ultrasonic frequency and a sound propagation velocity in the resonator. The resonator may comprise one or several lambda/2-elements. A resonator comprising several lambda/2-may be produced from one piece of material of an appropriate length or of several elements of a whole-number or of a whole-number multiple of 2, the elements being interconnected in an ultrasonic sound transmitting manner, e.g. by screwing, welding, bonding or pressing. Lambda/2-elements can comprise different material cross section geometries, e.g. circular, oval or rectangular cross-sections. The cross-section geometry of each of the lambda/2-elements may vary along a longitudinal axis of the respective lambda/2-element. Lamda/2-elements may be made of metallic or ceramic materials or of glass, in particular of titanium, titanium alloys, steel or steel alloys, aluminium or aluminium alloys and, e.g. of titanium grade 5 among others.

Media may be treated with ultrasonic sound in open systems, e.g. in the beaker. Some processes require introducing low-frequency-power-ultrasonic sound in reactor vessels. For instance medical or pharmaceutical applications require inexpensive receptacles, e.g. reactor vessels, which are disposed off after single use. In the receptacle, e.g. the reactor vessel, the medium may have a lower or a higher pressure compared to the ambient pressure. The higher pressure may be a pressure that is between ambient pressure and 1.000 bar, preferably between 1.1 bar and 4 bar, for instance 1.2 bar absolute.

In order to deliver the low-frequency-power-ultrasonic sound to the medium in the receptacle, a wall of the receptacle may be oscillated by the resonator that is pressed against an outer side of the wall. Alternatively, the resonator may be completely arranged inside the receptacle. In particular, the ultrasonic source may be arranged outside of the receptacle and the oscillations are conducted via one or several resonators into an internal space of the receptacle.

In order to effectively connect the wall of the receptacle to the ultrasonic resonator, the resonator is to be pressed onto or against the receptacle, e.g. the reactor vessel, which may have a soft or a rigid wall. Low-frequency-power-ultrasonic is a pressure sensitive technology. The inner pressure of the receptacle influences transmitting of ultrasonic sound. Furthermore, hydrodynamic forming of cavitation and other processes acting against the introduction and distribution of ultrasonic sound into the medium, for instance degassing, may effect the treatment.

In particular with receptacles having a soft wall, a sufficiently high inner pressure for creating a contact pressure between the receptacle and the resonator is often insufficient.

OBJECT

In view of these disadvantages of the known ultrasonic generators, an object of the invention is to provide an ultrasonic generator with which ultrasonic sound and in particular low-frequency-power-ultrasonic sound or oscillation can be effectively introduced into media arranged in or flowing through receptacles.

DETAILED DESCRIPTION

The object is achieved by a resonator that is formed with a clamping opening for clampingly receiving the receptacle for the medium.

This simple solution provides that the receptacle can be held in the clamping opening and be clamped at in at least two sides, e.g. opposite sides, thereby creating a contact pressure that allows for an efficient introduction of ultrasonic sound, e.g. low-frequency-power-ultrasonic oscillation, into the medium via an outer wall of the receptacle.

The solution according to the invention can be combined as desired and further improved by the further following embodiments that are advantages on their own in each case.

In order to be able to clamp the receptacle in the clamping opening, the resonator may be formed elastically deformable at least adjacent to the clamping opening. For instance, a wall of the resonator bordering the clamping opening may be soft and in particular elastically deformable. When the receptacle is pressed into the clamping opening, the elastic wall is deformed, creating contact pressure.

The clamping opening may at least sectionwise be formed complementary to the receptacle that is used for treating the medium. In particular, the opening may have a circular cross-section.

As ultrasonic sound is hard to transmit via a soft wall of the resonator, the wall of the resonator may be rigid. In order to be able to clamp the receptacle in the clamping opening, the resonator may be formed with at least one clamping jaw, the clamping jaw at least sectionwise bordering or confining on and being elastically deflectable towards the clamping opening.

In order to be able to deflect or elastically pivot the clamping jaw, a free end of the at least one clamping jaw may extend along a clamping groove. The free end of the clamping jaw can be pressed towards and into the clamping groove in order to compress the receptacle arranged in the clamping opening. The clamping groove may open into the clamping opening and connect the clamping opening with an area surrounding the resonator, thereby allowing for a pivoting movement of the clamping jaw not only at its free end, but also adjacent to the clamping opening.

In order to symmetrically compress the resonator towards the clamping opening at least from two opposite sides, the resonator may comprise two clamping jaws that flank the clamping opening on opposite sides. Both clamping jaws may be deflectable towards the clamping opening and for instance into the clamping groove in order to create the contact pressure acting on to the receptacle arranged in the clamping opening.

The clamping groove may be arranged between the two clamping jaws, the clamping groove opening into the clamping opening and connecting the clamping opening with an area surrounding the resonator.

The clamping jaws may be elastically deflectable towards each other, in order for symmetrically pressing the receptacle inside of the clamping opening from two opposite sides. In order to remove the receptacle from the clamping opening, a pressure forcing the clamping jaws towards each other has to be lowered such that the clamping jaws move away from each other, thereby widening the clamping opening and reducing the contact pressure.

The ultrasonic generator may comprise a fixing element for fixing the at least one clamping jaw in a deflected state. In the deflected state, the resonator clamps the receptacle, thereby creating the contact pressure. Due to the fixing element, the clamping jaw is held in the deflected state and the contact pressure is maintained by the fixing element.

The fixing element and the at least one clamping jaw may be formed in order to deflect the at least one clamping jaw. For instance, the fixing element may be formed as a screw, by which the clamping jaw can be pressed towards the clamping opening. By using a screw, high pressing forces can be created by screwing the screw.

The at least one clamping jaw may be shaped with a holder for at least sectionwise receiving the fixing element. A fixing element at least sectionwise arranged in the holder projects less from the resonator, thereby simplifying handling of the resonator. Furthermore, the fixing element may be undetachably received in the holder.

If the ultrasonic generator comprises two clamping jaws, both of the two clamping jaws may be deflected and affixed in their deflected state by the fixing element. Furthermore both of the two clamping jaws may be formed with the holder for the fixing element.

BRIEF DESCRIPTION OF THE DRAWINGS

Possible embodiments of the invention will be described hereinafter in greater detail and in an exemplary manner using advantages embodiments and with reference to the drawings. The described embodiments are only configurations, in which, however, the individual features as described above can be provided independently of one another or can be omitted in the drawings.

DETAILED DESCRIPTION OF THE DRAWINGS

Figure 1:
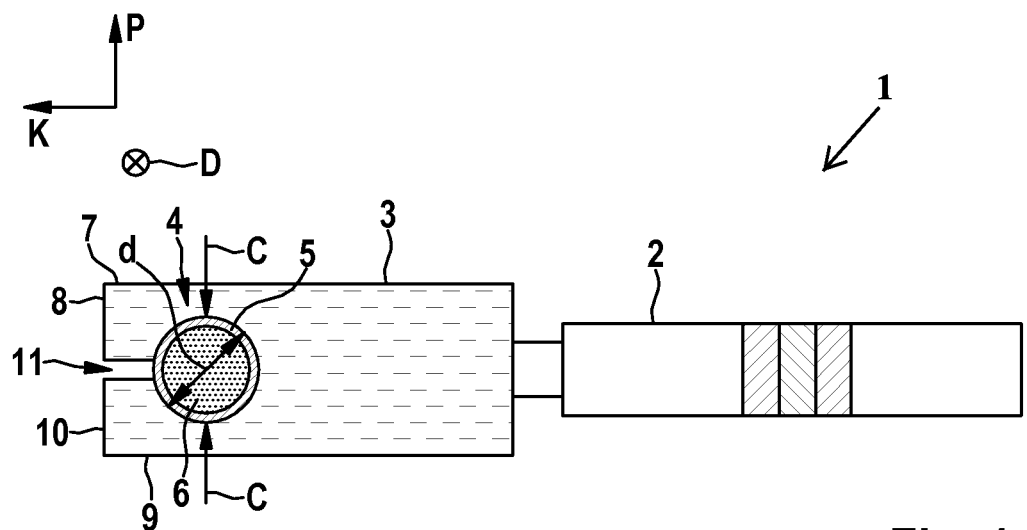
FIG. 1 is a schematic view of an exemplary embodiment of the ultrasonic generator.

First, an ultrasonic generator 1 is described with reference to FIG. 1. The ultrasonic generator 1 may comprise an ultrasonic source 2, e.g. a piezoelectric or a magnetostrictive source of ultrasonic sound. Furthermore, the ultrasonic generator 1 may have at least one resonator 3 that is connected to the ultrasonic source 2 in an ultrasonic sound receiving manner. The resonator 3 may be a sound transducer and may be formed of at least one material of a list comprising metallic material, ceramic material, glass, titanium, titanium alloy, steel, steel alloy, aluminium, aluminium alloy and in particular titanium grade 5. The resonator 3 can be formed of at least one lambda/2-element or of several lambda/2-elements. A resonator formed of several lambda/2-elements can be formed to be handled as one piece. The lambda/2-elements may be fixed to each other, e.g. by a method of a list of methods comprising screwing, welding, bonding and pressing. The lambda/2-elements may comprise various material cross-section geometries of a list of geometries comprising circular, oval and rectangular cross-sections. The cross-section geometry of each of the lambda/2-elements may vary along a longitudinal axis of the respective element.

Ultrasonic sound generated by the ultrasonic generator 1 may be low-frequency-power-ultrasonic sound with a frequency between 15 and 100 kHz, preferably 15 to 60 kHz and e.g. 26 kHz, having an acoustic power of more than 5 W, preferably between 10 and 32000 W, for instance 200 W. The low-frequency-power-ultrasonic oscillations preferably have amplitudes between 1 and 350 μm, preferably between 5 and 50 μm and e.g. 15 μm, for instance when emitted from the resonator 3.

The resonator 3 is formed with a clamping opening 4. The clamping opening 4 may completely extend through the resonator 3 in an insertion direction D, in which a receptacle for a medium to be treated with ultrasonic sound can be inserted into the clamping opening 4. The clamping opening 4 may alternatively be formed as a blind whole, opening against the insertion direction D and ending in the resonator 3 in the insertion direction D. Preferably, the clamping opening 4 is a piercing opening, opening to the surrounding of the resonator 2 in and against the insertion direction D.

In the exemplary embodiment of FIG. 1, a receptacle 5 with a medium 6 is arranged in the clamping opening 4. In order to create a contact pressure that is sufficient for efficiently transmitting ultrasonic sound from the resonator 3 to the medium 6, the receptacle 5 may be pressed into the clamping opening 4 in the insertion direction D. By pressing the receptacle 5 into the clamping opening 4 in the insertion direction D, a contact pressure C is generated, that acts from at least two sides and preferably two opposite sides on the receptacle 5. In particular, the contact pressure C is generated by inner walls of the resonator 3 bordering on the clamping opening 4 and contacting the receptacle 5. An outer diameter d1 of the receptacle 5 may be slighter larger than an inner diameter of the clamping opening 4 in an undeflected or undeformed state, such that this difference in size of the receptacle 5 and the clamping opening 4 creates the contact pressure C when pressing the receptacle 5 in the clamping opening 4.

In order to avoid that the receptacle 5 is deformed in an inadmissible manner, the resonator 3 may at least sectionwise be elastically deformable. For instance, the inner wall of the resonator 3 bordering on the clamping opening 4 may be soft and may be deformed by the receptacle 5 when it is pressed into the clamping opening 4. As a soft wall does not efficiently transmit ultrasonic sound, the wall may be rigid.

For avoiding undue information of the receptacle 5, at least a part of the resonator 3 adjacent the clamping opening 4 may be elastically deflectable and deflected in response of inserting the receptacle 5 in the clamping opening 4. In particular, a part of the resonator 3 may be deflectable away from the clamping opening 4. For instance, the resonator 3 is formed with a clamping jaw 7, the clamping jaw 7 extending along the clamping opening 4 towards its free end 8. The at least one clamping jaw 7 essentially extends from a section of the inner wall of the resonator 3, the section facing in a jaw direction K, and towards its free end 8. When elastically deflecting the clamping jaw 7, at least its free end 8 preferably swivels towards or away from the clamping opening 4 and in particular perpendicular to the insertion direction D. Hence, the contact pressure C preferably acts perpendicular to the insertion direction D, thereby avoiding that the receptacle 5 is pressed and thereby moved in or against the insertion direction D.

At least the free end 8 and preferably the complete clamping jaw 7 is separated from another section of the resonator 3 in the deflection direction P. The deflection direction P may extend perpendicular to the insertion direction D and/or the jaw direction K. In or against the deflection direction P, the clamping jaw 7 may be deflectable towards or away from the clamping opening 4.

Separating at least the free end 8 or the complete clamping jaw 7 from another section of the resonator 3 enables the movement of the clamping jaw 7 relative to the other section of the resonator 3, thereby widening or narrowing the clamping opening 4. The other section of the resonator 3 may be another clamping jaw 9 having a free end 10, the clamping jaws 7, 9 flanking the clamping opening 4 and extending parallel to a jaw direction K, the jaw direction K, extending perpendicular to the deflection direction P and the insertion direction D.

Between the clamping jaws 7, 9, a clamping groove or channel 11 may be extend from the clamping opening 4 in the jaw direction K. The clamping groove 11 may open into the clamping opening 4 on one end of the clamping groove 11 and to the surrounding of the resonator 3 at another, opposite opening of the clamping groove 11, thereby interconnecting the clamping opening 4 and the surrounding of the resonator 3 in the jaw direction K. Perpendicular to the jaw direction K, a dimension of the clamping groove 11 is preferably smaller than a dimension of the clamping groove 4.

Without a material bridge between the free ends 8, 10 of the clamping jaws 7, 9, the clamping jaws 7, 9 may be deformable and in particular deflectable in and/or against the deflection direction P, thereby providing for a symmetric deformation of the resonator 3 in the area of the clamping jaws 7, 9 when pressing the receptacle 5 in the clamping opening 4.

In the reflection direction P, a diameter of the clamping groove 11 may be smaller than the inner diameter of the clamping opening 4 in the same direction. Thereby providing that the receptacle 5 is held in the clamping opening 4 and is not pressed out of the clamping opening 4 in the jaw direction K by the contact pressure C.

Figure 2:
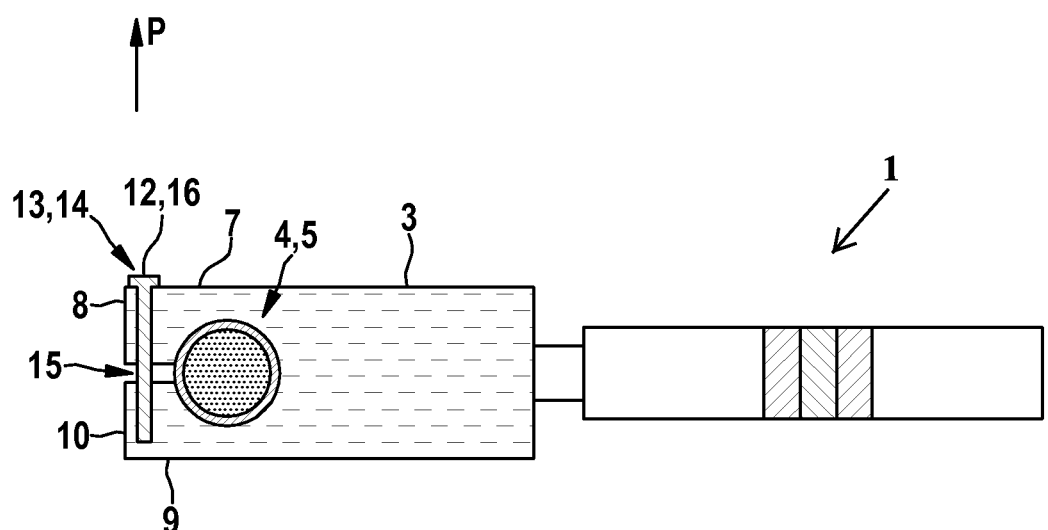
FIG. 2 is a schematic view of another exemplary embodiment of the ultrasonic generator.

FIG. 2 shows another exemplary embodiment of the ultrasonic generator 1. Same reference signs are being used for elements which correspond in function and/or structure to the embodiment of FIG. 1. For the sake of brevity, only the differences from the exemplary embodiment of FIG. 1 will be looked at.

In the exemplary embodiment of FIG. 2, the ultrasonic generator comprises a fixing element 12 for preventing a movement of the clamping jaws 7, 9 and in particular of their free ends 8, 10 away from each other parallel to the deflection direction P.

The fixing element 12 preferably prevents the clamping jaws 7, 9 to be pressed away from each other by the receptacle 5 when it is pressed into the clamping opening 4 beyond a given extend.

Additionally or alternatively, the fixing element may be used to press the clamping jaws 7, 9 towards each other, thereby narrowing the clamping opening 4 at least parallel to the reflection direction P. Thus, the pressure may not only be generated by pressing the receptacle 5 into the clamping opening 4, but also by the fixing element 12. In fact, with a fixing element 12, the inner diameter of the clamping opening 4 in an undeflected state of the clamping jaws 7, 9 may be equal or larger than the outer diameter D of the receptacle 5 such that the receptacle 5 can be easily inserted into the clamping opening 4. In order to generate the contact pressure C, the clamping jaws 7, 9 can be pressed towards each other by the fixing element 12, thereby pressing against the receptacle 5 with the contact pressure C.

The resonator 3 may be formed with a holder 13 for at least sectionwise receiving the fixing element 12. A fixing element 12 received in the holder 13 projects less from the resonator 3 and is protected against inadverted movements. For instance, the holder 13 may be an opening and e.g. a bore 14 extending through the clamping jaws 7, 9. Through the clamping jaw 7, the holder 13 may be formed as a piercing bore 14, such that the fixing element 12 can completely extend through the jaw 7. In clamping jaw 9, the holder 13 may be formed as a piercing bore or as a blind hole 15. In particular, the bore 15 may be shaped with an inner thread for afixing a threaded section of the holder 13. Hence, fixing element 12 is preferably a screw that can be inserted through the piercing bore 14 into the threaded bore 15. By screwing the screw into the threaded bore 15, a pressure can be created by a screw head 16 of the fixing element 12 on the clamping jaw 7 and the interacting threads of the clamping jaw 9 and the fixing element 12. The pressure forces the clamping jaws 7, 9 towards each other in order to create the contact pressure C.

What is claimed is:

1. Ultrasonic generator (1) with an ultrasonic source (2) for generating ultrasonic sound, and with a resonator (3) for emitting ultrasonic sound to a medium (6), the resonator (3) being connected to the ultrasonic source (2) in an ultrasonic sound receiving manner, wherein the resonator (3) is formed with a clamping opening (4) for clampingly receiving a receptacle (5) for the medium (6), and wherein the resonator (3) comprises two clamping jaws (7, 9) that flank the clamping opening (4) on opposite sides, the ultrasonic generator (1) comprising a fixing element (12) for fixing at least one of the two clamping jaws (7, 9) in a deflected state, characterized in that the fixing element (12) and the at least one of the two clamping jaws (7, 9) are formed in order to deflect the at least one of the two clamping jaws (7, 9) towards the clamping opening (4).

2. Ultrasonic generator (1) according to claim 1, characterized in that the resonator (3) is formed elastically deformable at least adjacent to the clamping opening (4).

3. Ultrasonic generator (1) according to claim 1, wherein the resonator (3) is formed with the at least one clamping jaw (7), the at least one of the two clamping jaws (7, 9) is at least sectionwise bordering on and are elastically deflectable towards the clamping opening (4).

4. Ultrasonic generator (1) according to claim 3, wherein a free end (8) of the at least one clamping jaw (7) extends along a clamping groove (11), the clamping groove (11) opening into the clamping opening (4) and into an area surrounding the resonator (3).

5. Ultrasonic generator (1) according to claim 1, wherein a clamping groove (11) is arranged between the two clamping jaws (7, 9).

6. Ultrasonic generator (1) according to claim 1, wherein the clamping jaws (7, 9) are elastically deflectable towards each other.

7. Ultrasonic generator (1) according to claim 1 wherein the at least one of the clamping jaws (7) is shaped with a holder (13) for at least sectionwise receiving the fixing element (12).

8. Ultrasonic generator (1) according to claim 1, characterized by a fixing element for fixing the two clamping jaws (7, 9) in a deflected state.

9. Ultrasonic generator (1) according to claim 8, wherein the fixing element (12) and the clamping jaws (7, 9) are formed in order to deflect the clamping jaws (7, 9) towards the clamping opening (4).

10. Ultrasonic generator (1) according to claim 8, wherein the clamping jaws (7, 9) are shaped with holders (13, 14, 15) for at least sectionwise receiving the fixing element (12).

11. Ultrasonic generator (1) according to claim 9, wherein the clamping jaws (7, 9) are shaped with holders (13, 14, 15) for at least sectionwise receiving the fixing element (12).

12. Ultrasonic generator (1) according to claim 1, wherein the at least one clamping jaw (7) is shaped with a holder (13) for at least sectionwise receiving the fixing element (12).

13. Ultrasonic generator (1) according to claim 5, wherein the clamping jaws (7, 9) are elastically deflectable towards each other.

14. Ultrasonic generator (1) according to claim 1, wherein said fixing element (12) comprises a screw; wherein screwing the screw applies a force pressing the at least one of the two clamping jaws (7, 9) towards the clamping opening.

15. Ultrasonic generator (1) according to claim 1, wherein said fixing element is inserted through a piercing bore (14) into bore (15) for applying pressure on the at least one of the two clamping jaws (7, 9).

\* \* \* \* \*